US011164530B2

(12) United States Patent
Park et al.

(10) Patent No.: US 11,164,530 B2
(45) Date of Patent: Nov. 2, 2021

(54) DISPLAY PANEL AND DISPLAY DEVICE

(71) Applicant: LG Display Co., Ltd., Seoul (KR)

(72) Inventors: JaeHoon Park, Paju-si (KR);
TaeHyoung Moon, Paju-si (KR);
SeonYeong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/684,119

(22) Filed: Nov. 14, 2019

(65) Prior Publication Data

US 2020/0168164 A1    May 28, 2020

(30) Foreign Application Priority Data

Nov. 27, 2018 (KR) .................. 10-2018-0148018

(51) Int. Cl.
*G09G 3/3291* (2016.01)
*H01L 27/32* (2006.01)

(52) U.S. Cl.
CPC ....... *G09G 3/3291* (2013.01); *H01L 27/3279* (2013.01)

(58) Field of Classification Search
CPC ........ H01L 27/3279; G09G 2320/0233; G09G 2320/045; G09G 2320/0223; G09G 2310/0251; G09G 2300/0861; G09G 2300/0465; G09G 2300/0426; G09G 2300/0819; G09G 2300/0842; G09G 3/3291; G09G 3/3659
USPC ................................................... 345/76, 204
See application file for complete search history.

(56) References Cited

U.S. PATENT DOCUMENTS

| | | | | |
|---|---|---|---|---|
| 2012/0050346 | A1* | 3/2012 | Sung | .................... G09G 3/3258 345/690 |
| 2015/0308951 | A1* | 10/2015 | Kim | ...................... G01N 21/59 356/433 |
| 2015/0372072 | A1* | 12/2015 | Xiong | ................. H01L 27/3279 257/40 |
| 2016/0190228 | A1* | 6/2016 | Park | .................... H01L 27/3279 257/40 |
| 2018/0151649 | A1* | 5/2018 | Han | ....................... H01L 51/50 |

OTHER PUBLICATIONS

Wikipedia, "Electrical resistivity and conductivity", May 2021, 22 pages (Year: 2021).*
Chemandy Electronics Ltd, "Rectangular Conductor Resistance Calculator", Dec. 2019, 1 page (Year: 2019).*

* cited by examiner

*Primary Examiner* — Jimmy H Nguyen
(74) *Attorney, Agent, or Firm* — Fenwick & West LLP

(57) ABSTRACT

A display panel and a display device. A driving voltage line disposed in an active area is disposed to overlap a reference voltage line. The aperture ratio of a display panel is improved, and the transparency of a transparent display device is improved. The width of the driving voltage line disposed in the display panel gradually decreases in a direction away from a driver circuit supplying a driving voltage. Differences in the variation of the driving voltage according to the areas of the display panel are reduced, thereby improving brightness uniformity of the display panel according to the areas of the display panel.

19 Claims, 13 Drawing Sheets

FIG.2
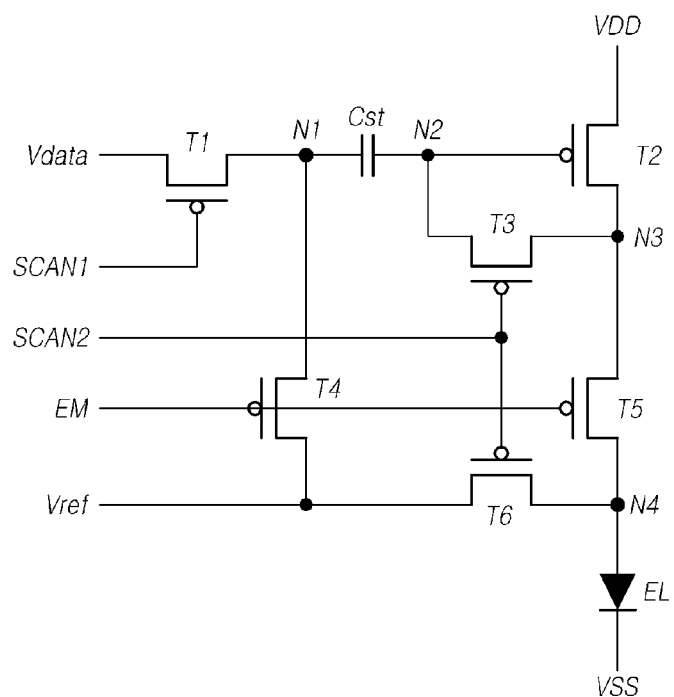
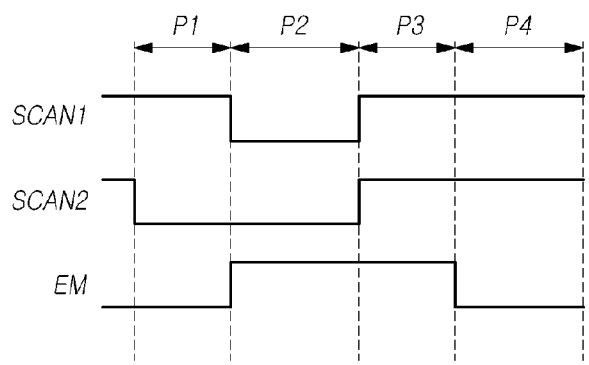

FIG. 7
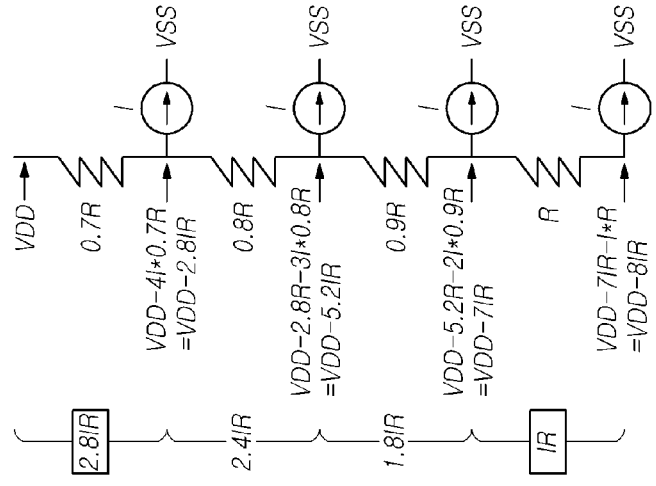
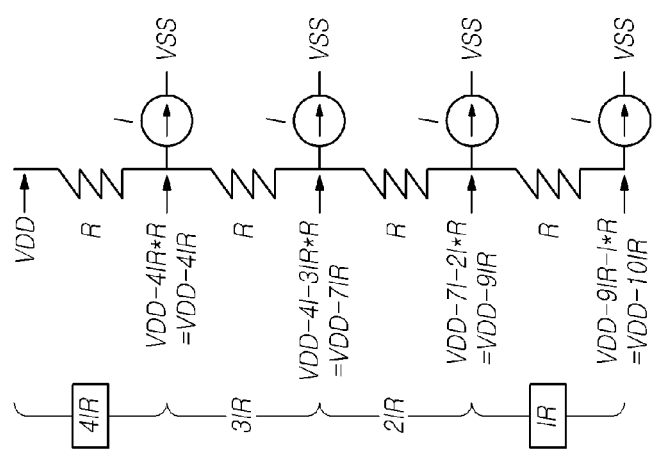

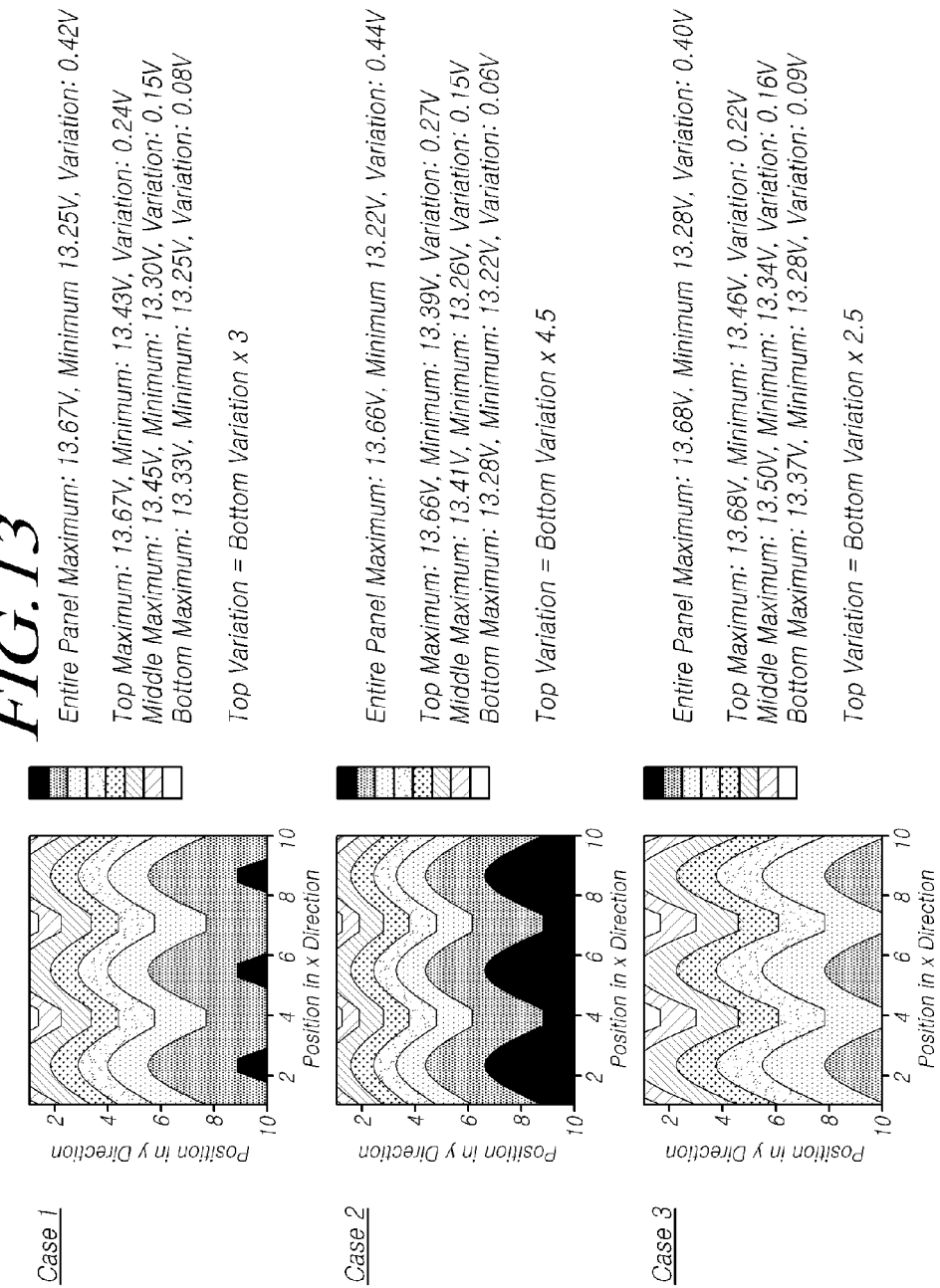

DISPLAY PANEL AND DISPLAY DEVICE

CROSS REFERENCE TO RELATED APPLICATION

This application claims priority to Republic of Korea Patent Application No. 10-2018-0148018, filed on Nov. 27, 2018, which is hereby incorporated by reference in its entirety.

BACKGROUND

Field

Embodiments relate to a display panel and a display device.

Description of Related Art

With the development of the information society, there has been increasing demand for a variety of image display devices. In this regard, a range of display devices, such as liquid crystal display (LCD) devices and organic light-emitting element (OLED) display devices, have recently come into widespread use.

In such display devices, the structure of subpixels may be complicated or types of signal lines, disposed in a display panel, as well as the number thereof, may be increased, depending on the type of display device.

Accordingly, the structure of subpixels and the types and number of signal lines may cause a number of difficulties in increasing the aperture ratio of the display panel. In addition, the quality of an image displayed on the display panel may be degraded, due to the array structure of subpixels or signal lines disposed in the display panel.

SUMMARY

Various aspects provide a display panel and a display device having a structure by which the aperture ratio of the display panel can be improved.

Also provided are a display panel and a display device able to improve the uniformity of image quality depending on the area of the display panel.

According to an aspect, a display device may include: a display panel in which a plurality of gate lines, a plurality of data lines, and a plurality of subpixels are disposed; a first voltage line disposed in an active area of the display panel in a first direction; a second voltage line disposed in a non-active area of the display panel; and a driver circuit connected to the first voltage line and/or the second voltage line to supply a voltage.

In at least one of the first voltage line, the second voltage line, and the first and second voltage lines, a portion disposed in the first direction may have a resistance difference such that the resistance of a portion thereof more adjacent to a connection point to the driver circuit is smaller than remaining locations thereof.

In addition, a location of the at least one of the first voltage line, the second voltage line, and the first and second voltage lines, more adjacent to the connection point to the driver circuit is wider than remaining locations thereof.

In addition, in the at least one of the first voltage line, the second voltage line, and the first and second voltage lines, the width of the portion disposed in the first direction may gradually decrease in a direction away from the connection point to the driver circuit. Here, the connection point may mean a point at which the voltage is supplied from the driver circuit.

The display device may further include a third voltage line disposed to overlap the first voltage line and be included in an area in which the first voltage line is disposed. The width of the third voltage line may be fixed or may decrease in the direction away from the point at which the voltage is supplied from the driver circuit.

According to another aspect, a display panel may include: a first voltage line disposed in an active area in a first direction; a second voltage line disposed in a non-active area; and a driver circuit supplying a voltage to the first voltage line and the second voltage line. In at least one of the first voltage line, the second voltage line, or the first and second voltage lines, a portion disposed in the first direction may have a width difference such that a location thereof more adjacent to a point at which the voltage is supplied from the driver circuit is wider than remaining locations thereof.

According to another aspect, a display device may include: a first voltage line disposed in an active area of a display panel in a first direction; a second voltage line disposed in a non-active area of the display panel; a first driver circuit disposed on one side of the display panel; and a second driver circuit disposed on the side portion of the display panel. In at least one of the first voltage line, the second voltage line, or the first and second voltage lines, a portion disposed in the first direction has a width difference such that locations thereof more adjacent to a point at which a voltage is supplied from the first driver circuit and a point at which a voltage is supplied from the second driver circuit are wider than remaining locations thereof.

In the at least one of the first voltage line, the second voltage line, or the first and second voltage lines, the width of the portion disposed in the first direction may gradually decrease in a direction from the point at which the voltage is supplied from the first driver circuit to a middle portion of the display panel and in a direction from the point at which the voltage is supplied from the second driver circuit to the middle portion of the display panel.

According to another aspect, a display device may comprise: a display panel with an active area; a first voltage line disposed in an active area of the display panel in a first direction; wherein, in the first voltage line, a location disposed in the first direction has a width difference such that a portion of the first voltage line more adjacent to at least one border of the active area is wider than remaining portions of the first voltage line.

According to exemplary embodiments, it is possible to increase the aperture ratio of the display panel without influencing display driving by providing a driving voltage line, disposed in the active area of the display panel, and through which a static voltage is applied at an event of display driving, to overlap a reference voltage line.

According to exemplary embodiments, a driving voltage line disposed in the display panel may be configured such that the width thereof gradually decreases in a direction away from a point at which a driving voltage is supplied. This configuration can reduce differences in the variation of the driving voltage according to the areas of the display panel, thereby improving the uniformity of image quality of the display panel.

According to some embodiments, a display device includes a display panel. The display panel includes a substrate and a plurality of gate lines, a plurality of data lines, and a plurality of subpixels on the substrate. The display device also includes a driver circuit, a first voltage line disposed on the substrate and extending a first direction, and a second voltage line disposed on the substrate. The driver circuit is connected to at least one of the first voltage line and or the second voltage line. The first voltage line is connected to one or more of the plurality of subpixels and is configured to receive a first driving voltage.

The second voltage line includes at least a first part extending in the first direction, and the second voltage line is configured to receive a second driving voltage different from the first driving voltage.

At least one of the first voltage line or the second voltage line includes a first portion having a first resistance and a second portion having a second resistance greater than the first resistance, the second portion located farther away from a location where the driver circuit is connected.

In some embodiments a display panel includes a first voltage line disposed on a substrate and extending in a first direction, and a second voltage line disposed on the substrate. The first voltage line is connected to one or more subpixels and is configured to receive a first driving voltage.

The second voltage line includes at least a first part extending in the first direction, and the second voltage line is configured to receive a second driving voltage different from the first driving voltage.

At least one of the first voltage line or the second voltage line includes a first portion having a first width and a second portion having a second width smaller than the first width, the second portion located farther away from a location where a driving voltage is supplied from a driver circuit than the first portion.

In some embodiments, a display device includes a first voltage line disposed on a substrate of a display panel circuit and extending in a first direction, a second voltage line disposed on the substrate, a first driver circuit disposed on one side of the display panel and configured to supply a driving voltage, and a second driver circuit disposed on another side of the display panel and configured to supply the driving voltage. The first voltage line is connected to one or more subpixels and is configured to receive a first driving voltage.

The second voltage line includes at least a first part extending in the first direction, and the second voltage line is configured to receive a second driving voltage different from the first driving voltage.

At least one of the first voltage line or the second voltage line includes a first portion having a first width, a second portion having a second width smaller than the first width, and a third portion having a third width greater than the second width. The second portion is located farther away from a location where the driving voltage is supplied from the first driver circuit than the first portion. The second portion is located farther away from a location where the driving voltage is supplied from the second driver circuit than the third portion.

BRIEF DESCRIPTION OF THE DRAWINGS

The above and other objects, features, and advantages of the present disclosure will be more clearly understood from the following detailed description, taken in conjunction with the accompanying drawings.

FIG. 2 illustrates a circuit structure of each of the subpixels arrayed in the display device and the driving timing thereof according to embodiments.

FIG. 7 illustrates an example of the variation of the first driving voltage according to the structure of the driving voltage line illustrated in FIG. 6.

FIGS. 12 and 13 illustrate simulation results in which the level of a driving voltage is varied, depending on variations in the width of the driving voltage line in the display device according to embodiments.

DETAILED DESCRIPTION

Figure 1:
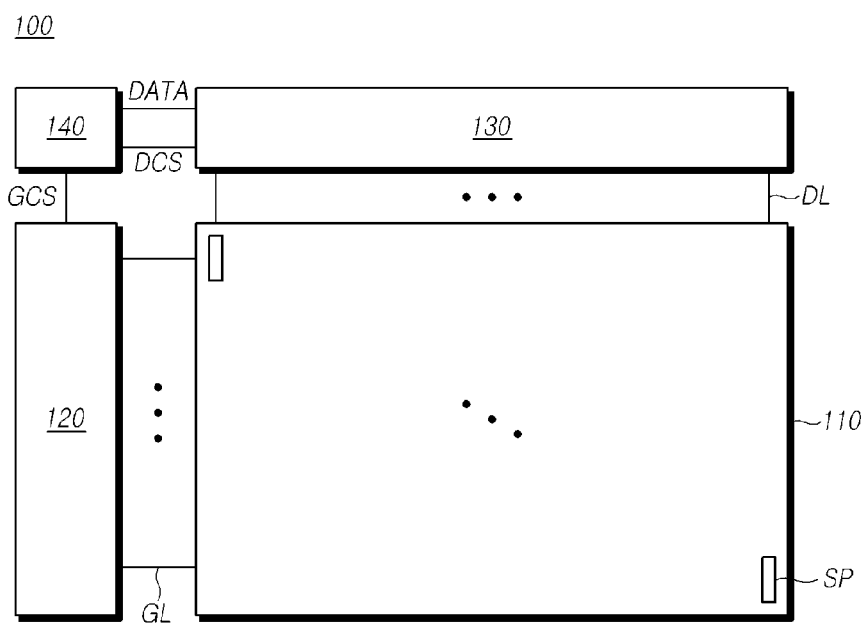
FIG. 1 illustrates a schematic configuration of a display device according to embodiments.

Hereinafter, some embodiments of the present disclosure will be described in detail with reference to the accompanying drawings. In describing the disclosure with reference to the accompanying drawings, the same elements will be referred to by the same reference numerals or signs regardless of the drawing numbers. When it is determined that detailed description of known configurations or functions involved in the disclosure makes the gist of the disclosure obscure, the detailed description thereof will not be made.

Terms such as first, second, A, B, (a), and (b) can be used to describe elements of the disclosure. These terms are merely used to distinguish one element from another element, and the essence, order, sequence, number, or the like of the elements is not limited to the terms. If it is mentioned that an element is "linked," "coupled," or "connected" to another element, it should be understood that the element can be directly coupled or connected to another element or still another element may be "interposed" therebetween or the elements may be "linked," "coupled," or "connected" to each other with still another element interposed therebetween.

FIG. 1 illustrates a schematic configuration of a display device 100 according to embodiments.

Referring to FIG. 1, the display device 100 according to embodiments may include a display panel 110 in which a plurality of subpixels SP are arrayed, as well as components for driving the display panel 110, such as a gate driver circuit 120, a data driver circuit 130, and a controller 140.

In the display panel 110, a plurality of gate lines GL and a plurality of data lines DL are disposed, and a plurality of subpixels SP are arrayed in areas in which the gate lines GL intersect the data lines DL. Each of the plurality of subpixels SP may include a plurality of circuit elements, and two or more subpixels may constitute a single pixel.

The gate driver circuit 120 is controlled by the controller 140, and controls the driving timing of the plurality of subpixels SP by sequentially outputting a scan signal to the plurality of gate lines GL disposed in the display panel 110. In addition, the gate driver circuit 120 may output an emission signal to control the emission timing of the subpixels SP. The circuit outputting the scan signal and the circuit outputting the emission signal may be provided integrally or separately.

The gate driver circuit 120 may include one or more gate driver integrated circuits (GDICs), and may be disposed on one or both sides of the display panel 110 depending on the driving system. In addition, the gate driver circuit 120 may be implemented using a gate-in-panel (GIP) structure disposed in a bezel of the display panel 110.

The data driver circuit 130 receives image data from the controller 140, and converts the image data into an analog data voltage. In addition, the data driver circuit 130 outputs the data voltage to the data lines DL in the timing in which the scan signal is applied through the gate lines GL, so that each of the subpixels SP expresses a luminous intensity according to the image data.

The data driver circuit 130 may include one or more source driver integrated circuits (SDICs). In addition, the data driver circuit 130 may be disposed on one or both sides (or on one or both portions) of the display panel 110 depending on the driving system.

The controller 140 controls the operations of the gate driver circuit 120 and the data driver circuit 130 by supplying a variety of control signals to the gate driver circuit 120 and the data driver circuit 130.

The controller 140 controls the gate driver circuit 120 to output the scan signal in the timing realized in each frame, converts image data, received from an external source, into a data signal format readable by the data driver circuit 130, and outputs the converted image data to the data driver circuit 130.

The controller 140 receives a variety of timing signals, including a vertical synchronization signal VSYNC, a horizontal synchronization signal HSYNC, an input data enable (DE) signal, a clock (CLK) signal, and the like, from an external source (e.g. a host system).

The controller 140 may generate a variety of control signals using the variety of timing signals received from the external source, and output the variety of control signals to the gate driver circuit 120 and the data driver circuit 130.

For example, the controller 140 outputs a variety of gate control signals GCS, including a gate start pulse (GSP) signal, a gate shift clock (GSC) signal, a gate output enable (GOE) signal, and the like, to control the gate driver circuit 120.

Here, the gate start pulse signal is used to control the operation start timing of one or more gate driver integrated circuits (ICs) of the gate driver circuit 120. The gate shift clock (GSC) signal is a clock signal commonly input to the one or more gate driver ICs to control the shift timing of the scan signal. The gate output enable (GOE) signal designates timing information of the one or more gate driver ICs.

In addition, the controller 140 outputs a variety of data control signals DCS, including a source start pulse (SSP) signal, a source sampling clock (SSC) signal, a source output enable (SOE) signal, and the like, to control the data driver circuit 130.

Here, the source start pulse (SSP) signal is used to control the data sampling start timing of one or more source driver integrated circuits (ICs) of the data driver circuit 130. The source sampling clock (SSC) signal is a clock signal controlling the sampling timing of data in each of the source driver ICs. The source output enable (SOE) signal controls the output timing of the data driver circuit 130.

The touch display device 100 may further include a power management IC (not shown) supplying various forms of voltage or current to the display panel 110, the gate driver circuit 120, the data driver circuit 130, and the like, or controls various forms of voltage or current to be supplied to the same.

In addition, voltage lines, through which a variety of signals and voltages are supplied, may be disposed in the display panel 110, in addition to the gate lines GL and the data lines DL.

In addition, in each of the subpixels SP, a plurality of circuit elements for driving the subpixel SP may be disposed.

FIG. 2 illustrates a circuit structure of each of the subpixels SP arrayed in the display device 100 according to embodiments.

Referring to FIG. 2, a plurality of transistors T1, T2, T3, T4, T5, and T6, a capacitor Cst, and a light-emitting element EL for driving the subpixel SP may be disposed in the in the subpixel SP.

That is, although FIG. 2 illustrates a 6T1C structure in which six transistors T1, T2, T3, T4, T5, and T6 and a single capacitor Cst are disposed, different circuit elements may be disposed in the subpixel SP, according to embodiments.

In addition, although the transistors T1, T2, T3, T4, T5, and T6 disposed in the subpixel SP are illustrated as being p-type transistors, n-type transistors may be provided as required.

The first transistor T1 is controlled by a first scan signal SCAN1, and controls a data voltage Vdata applied to a first node N1. Herein, the first transistor T1 may be referred to as a "switching transistor."

The second transistor T2 is controlled by a voltage of a second node N2, and controls the supply of a first driving voltage VDD. Herein, the first driving voltage VDD may be referred as a high-potential voltage for driving the subpixels SP. In addition, the second transistor may be referred as a "driving transistor."

The third transistor T3 is controlled by a second scan signal SCAN2, and is electrically connected between the second node N2 and a third node N3. The third transistor T3 may be referred to as a "compensation transistor."

The fourth transistor T4 is controlled by an emission signal EM, and controls a reference voltage Vref being applied to the first node N1. The fourth transistor T4 may be referred to as a "first emission transistor."

The fifth transistor T5 is controlled by the emission signal EM, and is electrically connected between the third node N3 and a fourth node N4. The fifth transistor T5 may be referred to as a "second emission transistor."

The sixth transistor T6 is controlled by the second scan signal SCAN2, and controls the reference voltage Vref being applied to the fourth node N4. The sixth transistor T6 may be referred to as an "initialization transistor."

The capacitor Cst is electrically connected between the first node N1 and the second node N2. The capacitor Cst can maintain the data voltage Vdata during a period in which the light-emitting element EL is generating light.

The light-emitting element EL may be, for example, an organic light-emitting diode (OLED), with an anode thereof being connected to the fourth node N4, and a second driving voltage VSS being applicable to a cathode thereof. Herein, the second driving voltage VSS may be a low-potential voltage for driving the subpixel SP.

Referring to the driving timing diagram illustrated in FIG. 2, in a first period P1, in a state in which the emission signal EM is at a low level, the second scan signal SCAN2 having a low level can be applied.

Accordingly, in a state in which the fourth transistor and the fifth transistor T5 are turned-on, the third transistor T3 and the sixth transistor T6 can be turned on. In addition, the first node N1, the second node N2, the third node N3, and the fourth node N4 can be initialized to a reference voltage Vref.

In a second period P2, in a state in which the second scan signal SCAN2 is at a low level, the first scan signal SCAN1 having a low level and the emission signal EM having a high level can be applied.

Consequently, the first transistor T1 can be turned on, and the fourth transistor 14 and the fifth transistor T5 can be turned off.

In addition, the data voltage Vdata can be applied to the first node N1, and a voltage, produced by removing a threshold voltage of the second transistor T2 from the first driving voltage VDD, can be applied to the second node N2. That is, in the second period P2, both the application of the data voltage Vdata and the compensation for the threshold voltage of the second transistor T2 can be performed.

In a third period P3, in a state in which the emission signal EM is at a high level, the first scan signal SCAN1 and the second scan signal SCAN2 having a high level can be applied. Consequently, the first node N1 and the second node N2 can be floated.

In a fourth period P4, in a state in which the first scan signal SCAN1 and the second scan signal SCAN2 are at a high level, the emission signal EM having a low level can be applied.

Consequently, the fourth transistor 14 and the fifth transistor T5 can be turned on, and a current in response to the data voltage Vdata can be supplied to the light-emitting element EL, so that the light-emitting element EL can emit light at a luminous intensity according to the data voltage Vdata.

The subpixel SP may be comprised of an area in which the above-described circuit elements are disposed and an area from which light is emitted by the light-emitting element EL.

Figure 3:
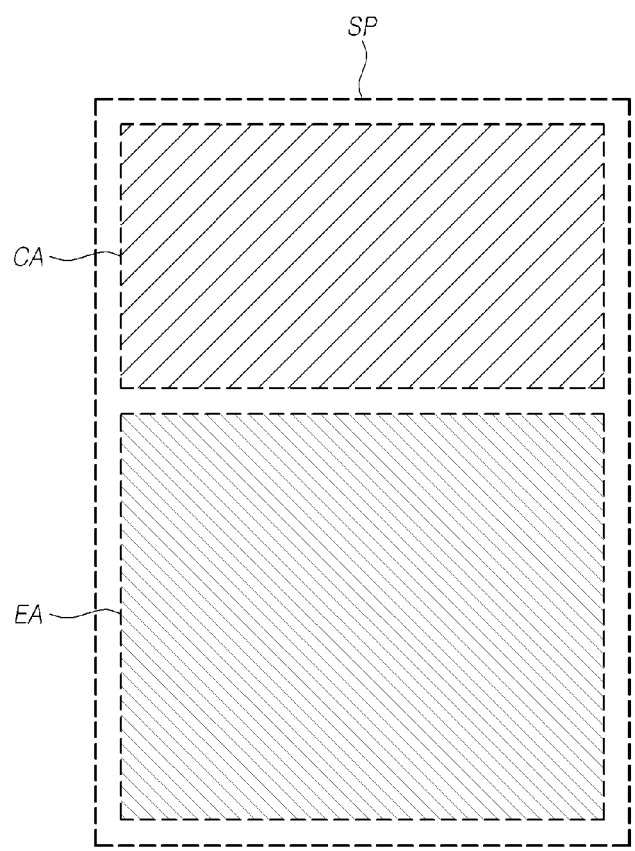
FIGS. 3 and 4 illustrate schematic examples of the structure of each of the subpixels arrayed in the display device according to embodiments.
Figure 4:
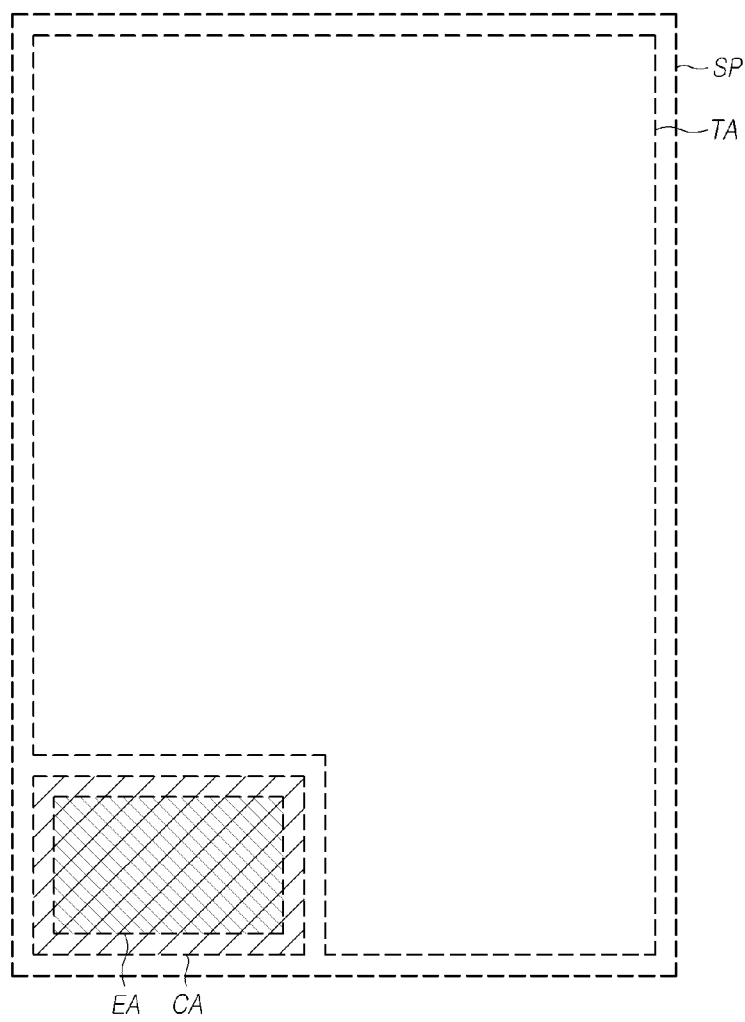

FIGS. 3 and 4 illustrate schematic examples of the structure of the subpixels SP arrayed in the display device 100 according to embodiments.

Referring to FIG. 3, each of the subpixels SP arrayed in the display device 100 according to embodiments may include a circuit area CA in which a plurality of circuit elements for driving the subpixel SP are disposed and an emission area EA on which a luminous intensity according to image data is expressed.

The circuit area CA may be an area that is covered to prevent the circuit elements or the like disposed therein from being damaged by external light or the like.

In addition, the emission area EA may be an open area on which an image in response to the driving the subpixel SP is displayed.

The circuit area CA and the emission area EA may be disposed in the subpixel SP so as not to overlap each other.

Here, the greater the ratio of the emission area EA to the circuit area CA in the subpixel SP is, the higher the aperture ratio and the quality of an image expressed by the subpixel SP may be. Thus, it is necessary to improve the aperture ratio of the subpixel SP.

In a case in which the display device 100 according to embodiments is transparent, a transparent area TA may be disposed in the subpixel SP to improve the transparency of the display panel 110, as shown in FIG. 4.

Referring to FIG. 4, the subpixel SP may include a circuit area CA in which circuit elements are disposed, an emission area EA in which light at a luminous intensity according to image data is emitted, and a transparent area TA.

The circuit area CA and the emission area EA may be disposed to overlap each other.

In addition, the area of the subpixel SP, other than the circuit area CA and the emission area EA, may be transparent (e.g. the transparent area TA).

Thus, the transparent display device 100 can be provided by disposing the transparent area TA in the subpixel SP.

As described above, in a case in which the display device 100 is transparent, it is necessary to increase the ratio of the transparent area TA to the area occupied by the emission area EA and the circuit area CA, disposed in the subpixel SP, to improve the aperture ratio and the transparency of the display device 100.

Embodiments provide a solution able to improve the aperture ratio of the subpixel SP without influencing the driving of the subpixel SP. In addition, although the display device 100 is illustrated as being transparent by way of example, the same may be applied to the opaque display device 100 to increase the aperture ratio.

Figure 5:
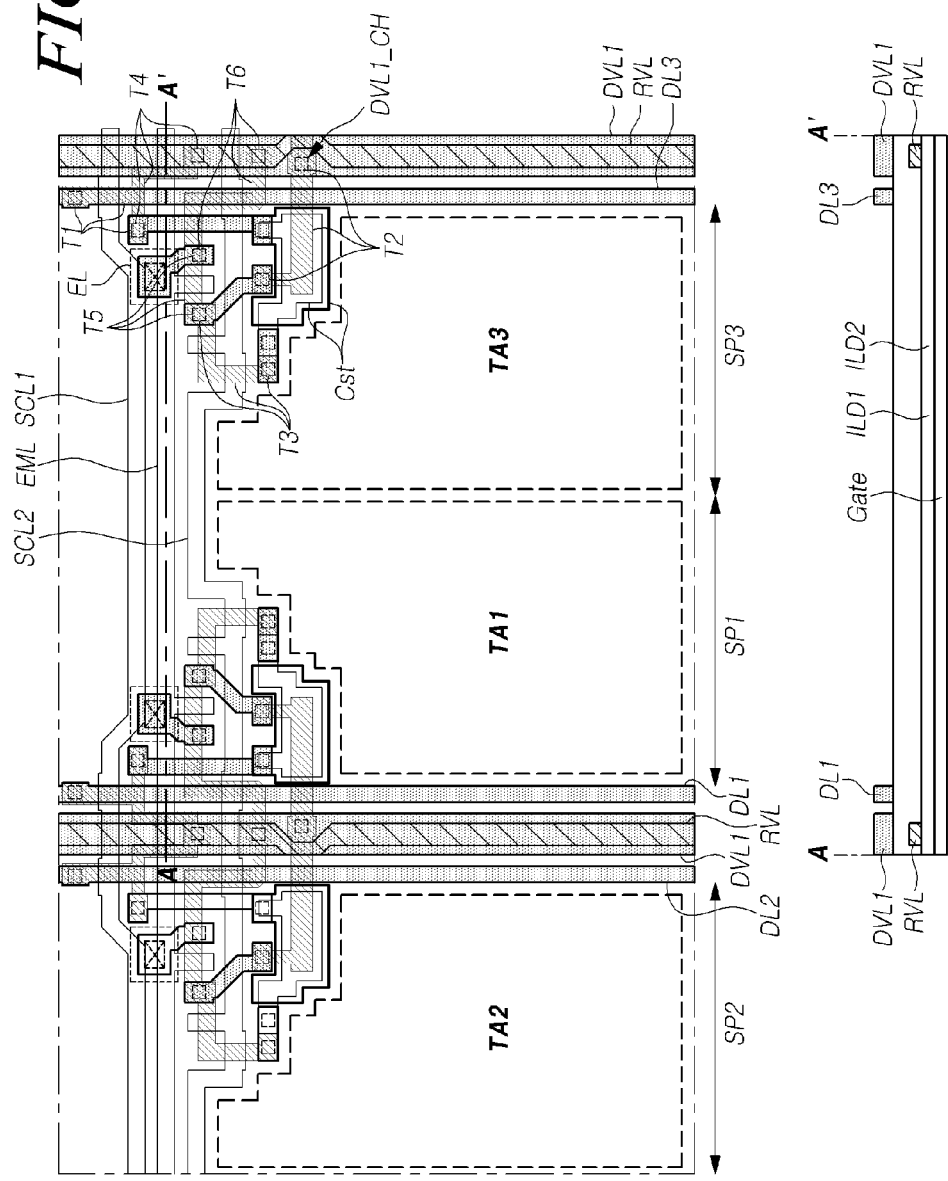
FIG. 5 illustrates a subpixel structure in a case in which the display device is a transparent display device according to embodiments.

FIG. 5 illustrates a structure of the subpixels SP in a case in which the display device 100 according to embodiments is a transparent display device.

Referring to FIG. 5, a first driving voltage line DVL1, through which a first driving voltage VDD for the driving of the subpixel SP is supplied, a reference voltage line RVL, through which a reference voltage Vref for the initialization of the subpixel SP or the like is supplied, a data line DL, through which a data voltage Vdata is supplied, may be disposed in an active area A/A of the display panel 110.

The first driving voltage line DVL1, the reference voltage line RVL, and the data line DL may be disposed in the display panel 110 extending in a first direction (e.g. a vertical direction).

In addition, although not shown in FIG. 5, a second driving voltage line DVL2, through which a second driving voltage VSS for the driving of the subpixel SP is supplied, may be disposed in a non-active area N/A (not shown in FIG. 5) of the display panel 110.

Here, the first driving voltage VDD may be a high-potential voltage supplied to the subpixel SP, while the second driving voltage VSS may be a low-potential voltage supplied to the subpixel SP. The first driving voltage VDD may be supplied by the data driver circuit 130. The second driving voltage VSS may be supplied by the data driver circuit 130. In some embodiments, the first driver voltage is higher than the second driving voltage.

In the active area A/A of the display panel 110, a plurality of gate lines GL may be disposed in a second direction (e.g. a horizontal direction).

In the plurality of gate lines GL, one or more gate lines GL may be connected to corresponding subpixels SP, depending on the structure and driving mode of the subpixel SP.

For example, as illustrated in FIG. 5, a first scan line SCL1 and a second scan line SCL2, through which a scan signal SCAN is applied, and an emission control line EML, through which an emission signal EM is applied, may be disposed.

The scan lines SCL and the emission control line EML may be driven by the same gate driver circuit 120 or may be driven by a separately-disposed gate driver circuit 120.

The subpixel SP may be disposed in an area defined by the intersection of the gate line GL and the data line DL.

A plurality of transistors T1, T2, T3, T4, T5, and T6, a capacitor Cst, a light-emitting element EL, and the like, which operate using signals, voltages, and the like, applied through the gate lines GL, the data line DL, and the like, may be disposed in the subpixel SP.

In addition, an area of the subpixel SP, in which none of the circuit elements and the like are disposed, may be a transparent area TA.

As described above, the transparent display device 100 can be provided by disposing the transparent area TA in a portion of the active area A/A of the display panel 110, in which none of the signal lines, the circuit elements of the subpixel SP, and the like, are disposed.

In addition, an overlapping structure may be provided to increase the ratio of the transparent area TA, i.e. the aperture ratio of the subpixel SP. That is, some of the signal lines disposed in the active area A/A may overlap each other.

For example, as illustrated in FIG. 5, the first driving voltage line DVL1, through which the first driving voltage VDD is supplied to the subpixel SP, and the reference voltage line RVL, through which the reference voltage Vref is supplied, may be configured to overlap each other.

In addition, the data lines DL (e.g. DL1, DL2, DL3) may be disposed on both sides of the first driving voltage line DVL1.

That is, referring to the cross-sectional structure of portion A-A' in FIG. 5, a first insulating layer ILD1 may be disposed on a gate metal Gate, from which the gate lines GL are formed, and the reference voltage line RVL may be disposed on the first insulating layer ILD1.

In addition, a second insulating layer ILD2 may be disposed on the reference voltage line RVL, and the first driving voltage line DVL1 and data lines DL1 and DL3 may be disposed on the second insulating layer ILD2.

Here, the reference voltage line RVL may be disposed, for example, on the same layer as a plate (e.g. a top plate), from which the capacitor Cst disposed in the subpixel SP is formed.

In addition, the first driving voltage line DVL1 may be disposed above the reference voltage line RVL to completely overlap the reference voltage line RVL.

Since the first driving voltage line DVL1 and the reference voltage line RVL have a static voltage applied thereto, the driving of the subpixel SP is unaffected, in the case in which the first driving voltage line DVL1 and the reference voltage line RVL are disposed to overlap each other.

In addition, since the first driving voltage line DVL1 completely overlaps the reference voltage line RVL, parasitic capacitance between the reference voltage line RVL and another signal line can be prevented.

Here, the first driving voltage line DVL1 may include a contact-hole area DVL1_CH for connection to the active area disposed below the gate metal Gate. That is, the first driving voltage line DVL1 may be connected to the active layer of a transistor through contact holes provided in the first insulating layer ILD1 and the second insulating layer ILD2 disposed therebelow.

Accordingly, the reference voltage line RVL, disposed below the first driving voltage line DVL1, may have a bypass structure in the contact-hole area DVL1_CH of the first driving voltage line DVL1. For example, the reference voltage line RVL may be disposed to pass around the contact-hole area DVL1_CH of the first voltage line.

Since the first driving voltage line DVL1 and the reference voltage line RVL overlap each other, the areas of the signal lines in the active area A/A can be reduced. In addition, the aperture ratio of the subpixels SP can be improved thereby.

That is, an increased area in which no signal lines are disposed may be present between adjacent subpixels SP, such that the transparency of the display panel 110 can be improved.

For example, as illustrated in FIG. 5, a first data line DL1, through which a first subpixel SP1 is driven, may be disposed adjacent to on one side of the first driving voltage line DVL1. In addition, a first transparent area TA1 may be disposed on one side of the first data line DL1.

In addition, a second data line DL2, through which a second subpixel SP2 is driven, and a second transparent area TA2 may be disposed adjacent to another side of the first driving voltage line DVL1.

A third transparent area TA3 of a third subpixel SP3 may be disposed adjacent to the first transparent area TA1 and the first subpixel.

That is, according to this structure, the first transparent area TA1 of the first subpixel SP1 and the third transparent area TA3 of the third subpixel SP3 may be connected in the second direction.

Accordingly, it is possible to increase the aperture ratio of the display panel 110 by increasing the ratio of the transparent area TA to the area occupied by the circuit area CA and the emission area EA in each of the subpixels SP, and in the case of the transparent display device 100, the transparency thereof can be improved. In some embodiments, the light-emitting element EL of a subpixel is an OLED, and the first driving voltage line DVL1 is connected to a driving transistor of the subpixel. In this case, the second driving voltage line DVL2 is connected to a cathode of the OLED.

In addition, according to embodiments of the present disclosure, it is possible to prevent luminous differences among the areas of the display panel 110 and thus improve the overall luminous uniformity of the display panel 110 by adjusting the widths of specific voltage lines disposed in the display panel 110.

Figure 6:
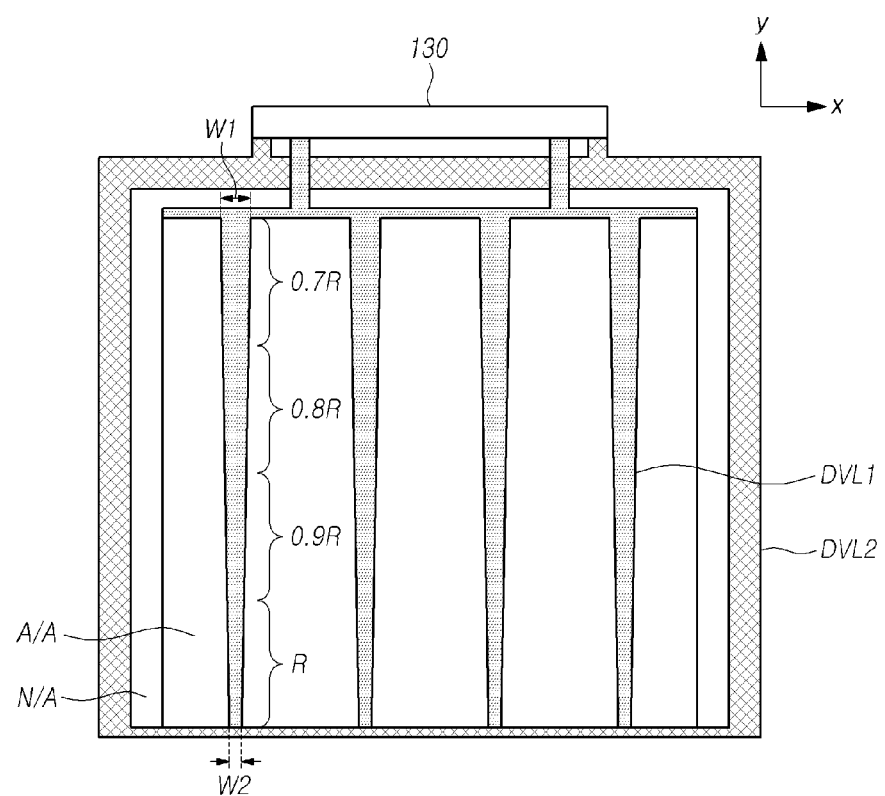
FIG. 6 illustrates an example structure of the driving voltage lines disposed in the display device according to embodiments.

FIG. 6 illustrates an example structure of the driving voltage lines DVL (DVL 1 and DVL 2) disposed in the display device 100 according to embodiments.

Referring to FIG. 6, the first driving voltage lines DVL1, through which a first driving voltage VDD is supplied to the subpixels SP, may be disposed in the active area A/A of the display panel 110, extending in a first direction (e.g. a vertical direction or a y-axis direction).

The first driving voltage lines DVL1 may be electrically connected to the driving transistors disposed in the subpixels SP, i.e. the above-described second transistors T2.

In addition, the second driving voltage lines DVL2, through which a second driving voltage VSS is supplied to the subpixels SP, may be disposed in the non-active area N/A of the display panel 110 along the peripheral portions of the display panel 110. For example, the second driving voltage line DVL2 may include a first part extending in the first direction and a second part extending the first direction. The first driving voltage line DVL1 may be between the first part of the second driving voltage line DVL2 and the second part of the second driving voltage line DVL2 in a second direction (e.g. horizontal direction). In a further embodiment, the second driving voltage line DVL2 may also include a third part extending in the second direction, and the third part of the second driving voltage line DVL2 may adjoin the first part of the second driving voltage line and the second part of the second driving voltage line. The second driving voltage lines DVL2 may be electrically connected to cathodes of the light-emitting elements EL disposed in the subpixels SP.

In a state in which the first driving voltage VDD and the second driving voltage VSS are supplied to the subpixels SP, each of the light-emitting elements EL disposed in the subpixels SP expresses a luminous intensity according to a data voltage Vdata, in response to the data voltage Vdata applied thereto.

Here, different amounts of current flow through the driving voltage lines DVL, depending on the position of the display panel 110. This may cause differences in the variation of the driving voltage VDD or VSS, applied through the driving voltage lines DVL, to be different.

In addition, differences in the variation of the driving voltage VDD or VSS may cause differences in luminous intensity depending on the position of the display panel 110 even when the same data voltage Vdata is applied.

That is, the brightness of the light-emitting element EL, disposed in the subpixel SP, can be determined by Vgs and Vds applied to the driving transistor.

Here, the variation of the driving voltages VDD and VSS, applied to the subpixel SP, may change Vgs and Vds, so that the subpixel SP can express different levels of brightness even in the case in which the same data voltage Vdata is applied. In addition, such differences in the variation of the driving voltages and VSS, depending on the position of the display panel 110, may lower brightness uniformity depending on the position of the display panel 110.

Accordingly, embodiments of the present disclosure make it possible to reduce differences in the variation of the driving voltages VDD and VSS, applied through the driving voltage lines DVL, by adjusting the width of the driving voltage lines DVL, disposed in the display panel 110, so that differences in brightness, depending on the position of the display panel 110, can be reduced.

For example, as illustrated in FIG. 6, in each of the first driving voltage lines DVL1 disposed in the active area A/A of the display panel 110 in the first direction, a portion adjacent to the data driver circuit 130 supplying the first driving voltage VDD may be wider than the remaining portions.

That is, the width W1 of a portion of the first driving voltage line DVL1, most adjacent to a point at which the first driving voltage VDD is supplied to the first driving voltage line DVL1, may be wider than the width W2 of a portion of the first driving voltage line DVL1 most remote from the point at which the first driving voltage VDD is supplied.

For example, the first driving voltage line DVL1 may include a first portion having a first width and a second portion having a second width smaller than the first width, the second portion located farther away from a location where the first driving voltage VDD is supplied from the data driver circuit 130 than the first portion.

In addition, the width of the first driving voltage line DVL1 may gradually decrease in a direction away from the point at which the first driving voltage VDD is supplied.

Thus, as illustrated in FIG. 6, the resistance of the first driving voltage line DVL1 according to the sections thereof (i.e. in different sections thereof) may increase in the direction away from the location where the first driving voltage VDD is supplied (e.g. 0.7R, 0.8R, 0.9R, R).

That is, the first driving voltage line DVL1 is configured such that the resistance of a section thereof, in which a relatively greater amount of current flows, is smaller than those of the remaining sections thereof, so that the variation of the first driving voltage VDD according to the sections of the first driving voltage line DVL1 can be reduced.

In addition, since the first driving voltage line DVL1 is configured such that the section thereof, through which a relatively smaller amount of current flows, has a relatively greater resistance, differences in the variation of the first driving voltage VDD according to the sections of the first driving voltage line DVL1 can be minimized.

Here, in the first driving voltage lines DVL1, a portion disposed in a second direction (e.g. a horizontal direction or an x-axis direction) may have a fixed width, such that a portion having no effect on the brightness non-uniformity due to the variation of the first driving voltage VDD may have equal resistance.

As described above, since differences in the variation of the first driving voltage VDD applied to the subpixels SP, according to the area of the display panel 110, are reduced, differences in the brightness according to the area of the display panel 110, due to differences in the variation of the first driving voltage VDD, can be prevented.

Accordingly, the overall brightness uniformity of the display panel 110 can be improved.

FIG. 7 illustrates an example of the variation of the first driving voltage VDD according to the structure of the driving voltage line DVL illustrated in FIG. 6.

Referring to FIG. 7, in a case in which a fixed amount of current is regarded as flowing through the areas of the display panel 110, corresponding to the sections of the first driving voltage line DVL1, amounts of the variation of the first driving voltage VDD, occurring according to the sections of the first driving voltage line DVL1, i.e. reductions in the first driving voltage VDD, are illustrated.

In a case in which the width of the first driving voltage line DVL1 is fixed, the section, most adjacent to the point at which the first driving voltage VDD, can have the greatest amount of current. In the corresponding section, the variation of the first driving voltage VDD can be observed to be high, e.g. a level of 4IR.

In addition, since the section, most remote from the point at which the first driving voltage VDD, has the smallest amount of current, the variation of the first driving voltage VDD in the corresponding section may be observed to be low, e.g. a level of IR.

Thus, the first driving voltage VDD may vary according to the sections of the first driving voltage line DVL1 such that the greatest variation is four times the smallest variation. Accordingly, the areas of the display panel 110 may have different levels of brightness.

In contrast, in a case in which the width of the first driving voltage line DVL1 gradually decreases in the direction away from the point at which the first driving voltage VDD is supplied, the section of the first driving voltage line DVL1, most adjacent to the point at which the first driving voltage VDD is supplied, has a smaller resistance while having a greater amount of current. Thus, the variation of the first driving voltage VDD in the corresponding section can be 2.8IR.

In addition, the section of the first driving voltage line DVL1, most remote from the point at which the first driving voltage VDD is supplied, has a greater resistance while having a smaller amount of current. Thus, the variation of the first driving voltage VDD in the corresponding section may be IR.

In this manner, the first driving voltage VDD according to the sections of the first driving voltage line DVL1 varies such that the greatest variation is about 2.8 times the smallest variation. Accordingly, differences in the variation of the first driving voltage VDD according to the areas of the display panel 110 can be reduced.

In addition, such reduced differences in the variation of the first driving voltage VDD can result in reducing brightness differences according to the areas of the display panel 110 while improving the brightness uniformity of the display panel 110.

Such a structure adjusting the width of the driving voltage line DVL may be applied to the second driving voltage line DVL2 disposed in the non-active area N/A of the display panel 110.

Figure 8:
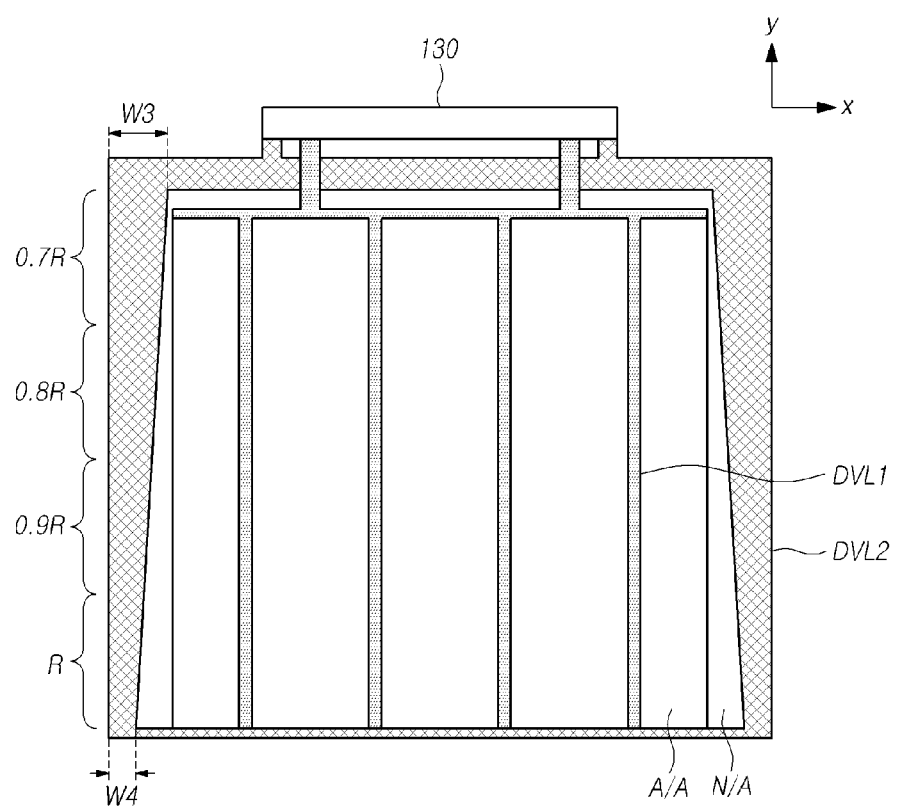
FIG. 8 illustrates another example structure of the driving voltage lines disposed in the display device according to embodiments.

FIG. 8 illustrates another example structure of the driving voltage lines DVL (DVL1 and DVL2) disposed in the display device 100 according to embodiments.

Referring to FIG. 8, the first driving voltage lines DVL1 may be disposed in the active area A/A of the display panel 110 extending in the first direction. In addition, the second driving voltage lines DVL2 may be disposed in the non-active area N/A of the display panel 110 along the peripheral portions of the display panel 110.

In each of the second driving voltage lines DVL2 disposed in the first direction, i.e. the y-axis direction, the width of a portion, disposed most adjacent to the data driver circuit 130 supplying the second driving voltage VSS, may be widest.

For example, as illustrated in FIG. 8, in the second driving voltage line DVL2 disposed in the first direction, the width W3 of the portion, most adjacent to the point at which the second driving voltage VSS is supplied, may be wider than the width W4 of the portion most remote from the point at which the second driving voltage VSS is supplied.

For example, the second driving voltage line DVL2 may include a first part extending in the first direction. The first part of the second driving voltage line DVL2 may include a first portion having a first width and a second portion having a second width smaller than the first width, the second portion located farther away from a location where the second driving voltage VSS is supplied from the data driver circuit 130 than the first portion.

In addition, the width of the second driving voltage line DVL2 may gradually decrease in a direction away from the point at which the second driving voltage VSS is supplied, and thus, the resistance of the second driving voltage line DVL2 according to the sections thereof may gradually increase (e.g. 0.7R, 0.8R, 0.9R, and R).

That is, in each of the second driving voltage lines DVL2 disposed in the first direction, the resistance of the portion having a greater amount of current can be reduced, while the resistance of the portion having a smaller amount of current can be increased. Accordingly, this can reduce differences in the variation of the second driving voltage VSS occurring in the respective sections.

In addition, in the second driving voltage lines DVL2, a portion disposed in the second direction may have a fixed width, such that a portion having no effect on brightness non-uniformity due to the variation of the second driving voltage VSS may have equal resistance.

Accordingly, when differences in the variation of the second driving voltage VSS according to the areas of the display panel 110 are reduced as described above, the area-specific brightness uniformity of the display panel 110 can be prevented from being lowered due to the variation of the second driving voltage VSS supplied to the subpixels SP.

Figure 9:
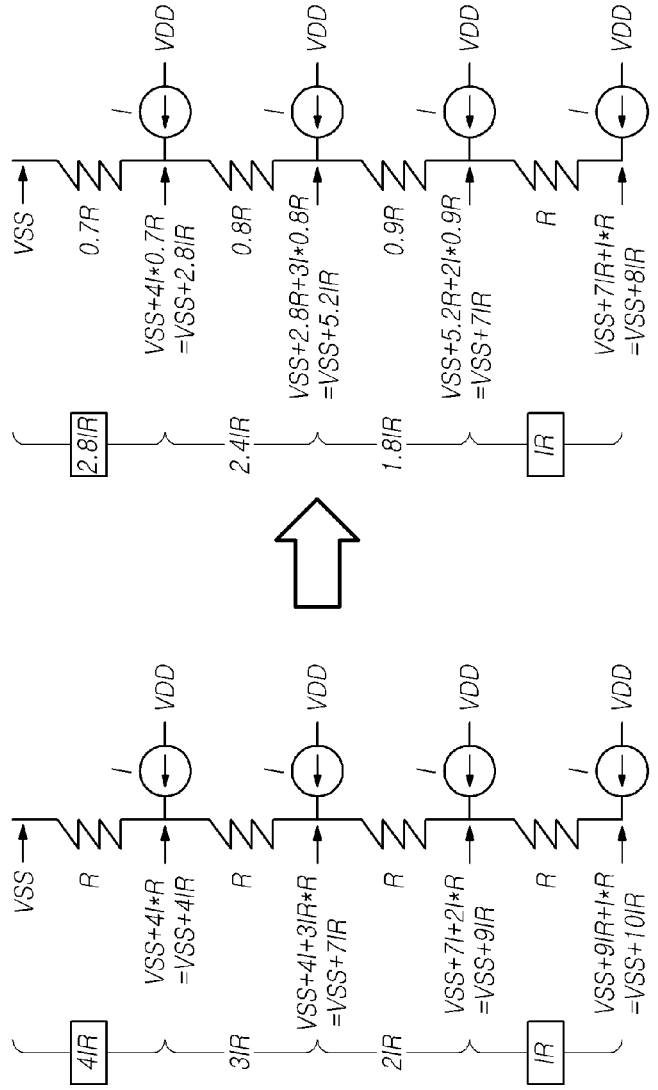
FIG. 9 illustrates an example of the variation of the second driving voltage according to the structure of the driving voltage lines illustrated in FIG. 8.

FIG. 9 illustrates an example of the variation of the second driving voltage VSS according to the structure of the driving voltage lines DVL illustrated in FIG. 8.

Referring to FIG. 9, in a case in which a fixed amount of current is taken as flowing through the areas of the display panel 110 corresponding to the sections of the second driving voltage line DVL2, amounts of the variation of the second driving voltage VSS, i.e. rises in the first driving voltage VDD, occurring according to the sections of the second driving voltage line DVL2, are illustrated.

In a case in which the width of the second driving voltage line DVL2 is fixed, the variation of the second driving voltage VSS in the section most adjacent to the point at which the second driving voltage VSS is supplied can be 4IR, while the variation of the second driving voltage VSS in the section most remote from the point at which the second driving voltage VSS is supplied can be IR.

Thus, the second driving voltage VSS may vary according to the sections of the second driving voltage line DVL2 such that the greatest variation is four times the smallest variation.

In contrast, in a case in which the width of the second driving voltage line DVL2 gradually decreases in the direction away from the point at which the second driving voltage VSS is supplied, the variation of the second driving voltage VSS in the section most adjacent to the point at which the second driving voltage VSS is supplied can be 2.8IR.

In this manner, the second driving voltage VSS according to the sections of the second driving voltage line DVL2 varies such that the greatest variation in the section most adjacent to the point at which the second driving voltage VSS is about 2.8 times the smallest variation in the section most remote from the point at which the second driving voltage VSS. Accordingly, differences in the brightness according to the areas of the display panel 110 can be reduced by reducing the variation of the second driving voltage VSS.

Figure 10:
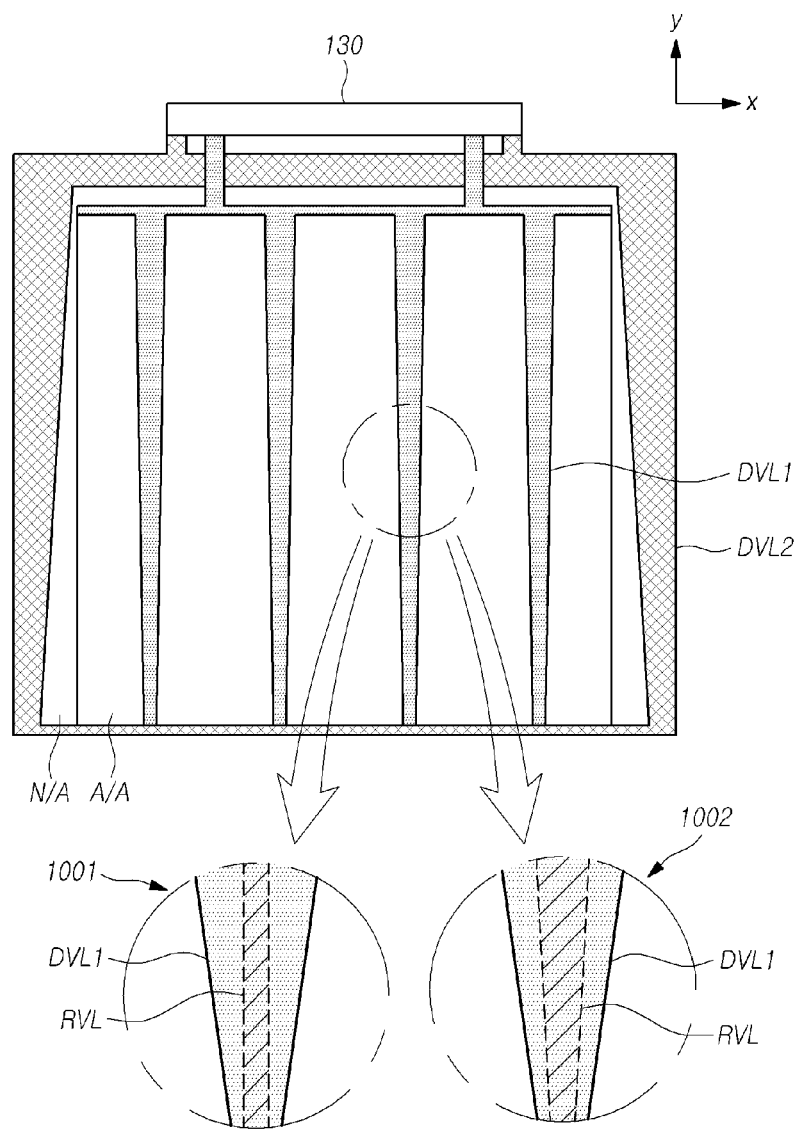
FIG. 10 illustrates another example structure of the driving voltage lines disposed in the display device according to embodiments.

FIG. 10 illustrates another example structure of the driving voltage lines DVL (DVL1 and DVL2) disposed in the display device 100 according to embodiments.

Referring to FIG. 10, the first driving voltage lines DVL1 may be disposed in the active area A/A of the display panel 110, extending in a first direction. In addition, the second driving voltage lines DVL2 may be disposed in the non-active area N/A of the display panel 110, with portions of the second driving voltage lines DVL2 being disposed in a first direction.

Here, the width of each of the first driving voltage lines DVL1 disposed in the first direction may gradually decrease in a direction away from the location where the first driving voltage VDD is supplied.

In addition, the width of each of the second driving voltage lines DVL2 disposed in the first direction may gradually decrease in the direction away from the location where the second driving voltage VSS is supplied.

Since the width of the first driving voltage line DVL1 disposed in the first direction and the width of the second driving voltage line DVL2 disposed in the first direction gradually decrease in the direction away from the points at which the second driving voltages VDD and VSS are supplied as described above, differences in the variation of the driving voltages VDD and VSS according to the sections of the driving voltage line DVL can be reduced, thereby preventing brightness non-uniformity according to the areas of the display panel 110.

In addition, the width of the reference voltage line RVL overlapping the first driving voltage line DVL1 may be fixed, as indicated with 1001, or the width of the reference voltage line RVL may gradually decrease in a direction away from the data driver circuit 130, as indicated with 1002.

That is, the reference voltage line RVL has no effect on the brightness of the subpixels SP, since a reference voltage Vref for initialization of the subpixels SP or the like is applied thereto. However, the width of the reference voltage line RVL may be determined such that the first driving voltage line DVL1 completely overlaps the reference voltage line RVL in order to prevent parasitic capacitance between the reference voltage line RVL and other signal lines.

In addition, the structure of the driving voltage lines DVL as described above may be used in a case in which the data driver circuit 130 is disposed on both sides of the display panel 110, depending on the type of the display device 100.

Figure 11:
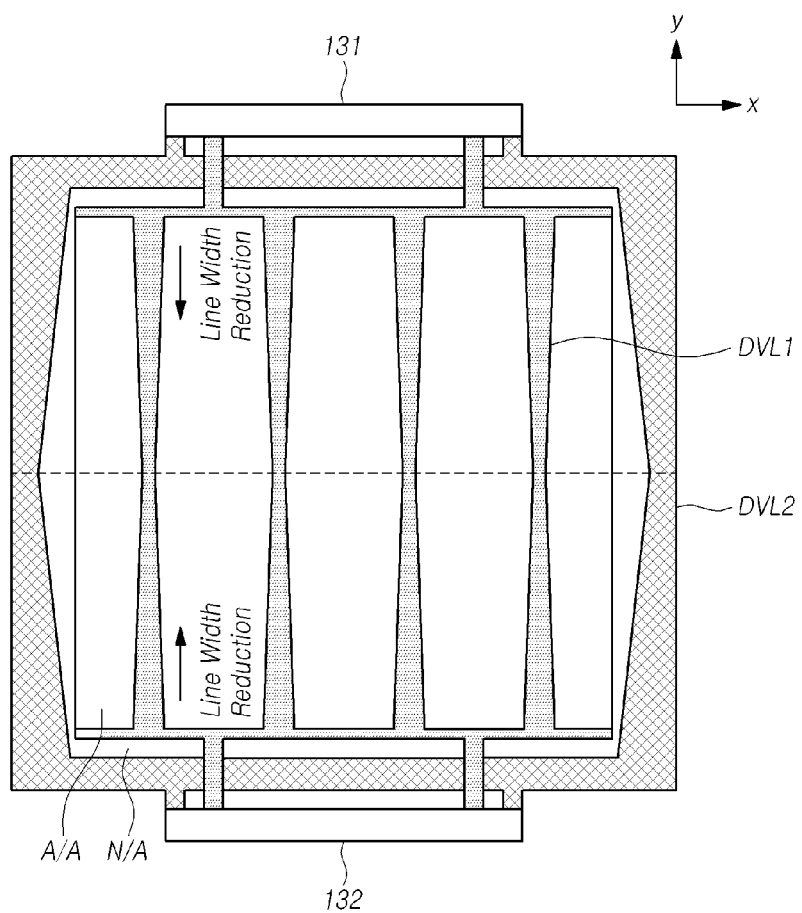
FIG. 11 illustrates another example structure of the driving voltage lines disposed in the display device according to embodiments.

FIG. 11 illustrates another example structure of the driving voltage lines DVL (DVL1 and DV12) disposed in the display device 100 according to embodiments.

Referring to FIG. 11, in the display device 100 according to embodiments, a first data driver circuit 131 may be disposed on one side of the display panel 110, and a second data driver circuit 132 may be disposed on the other side of the display panel 110.

The first data driver circuit 131 can drive a portion, e.g. a top portion, of the display panel 110, while the second data driver circuit 132 can drive a bottom portion of the display panel 110. Alternatively, the first data driver circuit 131 and the second data driver circuit 132 can drive the entire area of the display panel 110.

In the active area A/A of the display panel 110, the first driving voltage lines DVL1 may be disposed in a first direction.

The width of the first driving voltage lines DVL1 extending in the first direction may decrease in a direction from a portion adjacent to the first data driver circuit 131 to a middle portion of the display panel 110. The width of the first driving voltage lines DVL1 extending in the first direction may also decrease in a direction from a portion adjacent to the second data driver circuit 133 to the middle portion of the display panel 110.

For example, the first driving voltage line DVL1 may have a first portion having a first width, a second portion having a second width smaller than the first width, and a third portion having a third width larger than the second width. The second portion is located farther away from a location where the first driver circuit 131 supplies the first driving voltage VDD than the first portion. The second portion is also located farther away from a location where the second driver circuit 132 supplies the first driving voltage VDD than the third portion. The second portion may be disposed between the first portion and the third portion.

In addition, the second driving voltage lines DVL2 may be disposed in the non-active area N/A of the display panel 110, with portions of the second driving voltage lines DVL2 being disposed in the first direction.

The widths of the portions of the second driving voltage lines DVL2 disposed in the first direction may decrease in a direction from a portion more adjacent to the first data driver circuit 131 to the middle portion of the display panel 110. The widths of the portions of the second driving voltage lines DVL2 disposed in the first direction may decrease in a direction from a portion more adjacent to the second data driver circuit 132 to the middle portion of the display panel 110.

That is, in the structure in which the driving voltages VDD and VSS are supplied to the driving voltage lines DVL from both sides of the display panel 110, the widths of the driving voltage lines DVL may decrease in the direction from the portions at which the driving voltages VDD and VSS are supplied to the middle portion of the display panel 110.

For example, the second driving voltage line DVL2 may have a first portion having a first width, a second portion having a second width smaller than the first width, and a third portion having a third width larger than the second width. The second portion is located farther away from a location where the first driver circuit 131 supplies the second driving voltage VSS than the first portion. The second portion is also located farther away from a location where the second driver circuit 132 supplies the second driving voltage VSS than the third portion. The second portion may be disposed between the first portion and the third portion.

Accordingly, differences in the variation of the driving voltages VDD and VSS according to the areas of the display panel 110 can be reduced, and brightness non-uniformity due to differences in the variation of the driving voltages VDD and VSS can be prevented.

Figure 12:
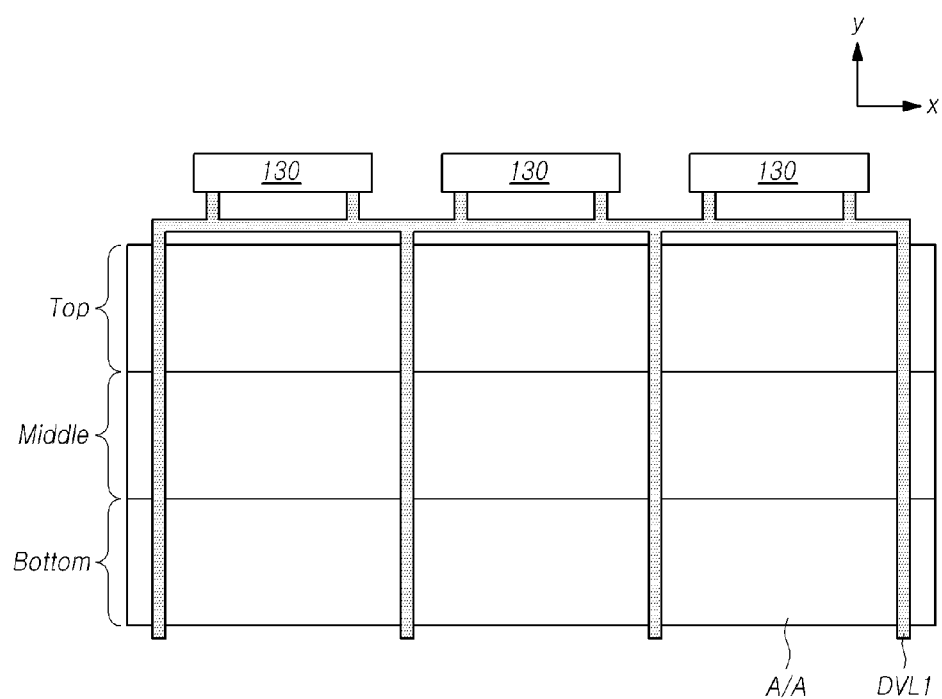

FIGS. 12 and 13 illustrate simulation results in which the level of a driving voltage is varied, depending on variations in the width of the first driving voltage line DVL1 in the display device 100 according to embodiments.

Referring to FIGS. 12 and 13, in a case in which the first driving voltage line DVL1 is disposed in the active area A/A of the display panel 110 in the first direction, variations in the first driving voltage VDD in three sections Top, Middle, and Bottom of the display panel 110 were simulated by varying the width of the first driving voltage line DVL1.

Case 1 is a simulation of a situation in which the width of the first driving voltage line DVL1 is fixed. The variation in the top portion of the display panel 110 is 0.24V, the variation in the middle portion of the display panel 110 is 0.15V, and the variation in the bottom portion of the display panel 110 is 0.08V. It can be appreciated that the variation in the top portion is three times the variation in the bottom portion.

Case 2 is a simulation of a situation in which the width of the first driving voltage line DVL1 gradually increases in the direction of the bottom portion of the display panel 110. The variation in the top portion of the display panel 110 is 0.27V, while the variation in the bottom portion of the display panel 110 is 0.06V. It can be appreciated that the variation in the top portion is 4.5 times the variation in the bottom portion.

Case 3 is a simulation of a situation in which the width of the first driving voltage line DVL1 gradually decreases in the direction of the bottom portion of the display panel 110. The variation in the top portion of the display panel 110 is 0.22V, while the variation in the bottom portion of the display panel 110 is 0.09V. It can be appreciated that the variation in the top portion is 2.4 times the variation in the bottom portion, and that the difference between the variation in the top portion and the variation in the bottom portion is reduced.

According to the above-described embodiments, the first driving voltage line DVL1 and the reference voltage line RVL are disposed to overlap each other in the active area A/A of the display panel 110, so that the aperture ratio of the display panel 110 can be improved.

In particular, in a case in which the display device 100 is a transparent display device, the transparent area TA can be increased to improve the transparency of the display device 100.

In addition, according to embodiments of the present disclosure, the width of the driving voltage line DVL gradually decreases in a direction away from the points at which the driving voltages VDD and VSS are applied, so that differences in the variations of the driving voltages VDD and VSS according to the sections of the driving voltage line DVL can be reduced.

Accordingly, differences in the variation of the driving voltages VDD and VSS according to the areas of the display panel 110 can be reduced, thereby improving brightness uniformity in different areas of the display panel 110.

The above description merely exemplifies the technical idea of the present disclosure, and various modifications and changes can be made by those skilled in the art without departing from the essential features of the disclosure. The embodiments disclosed in the disclosure are not for restricting the technical idea of the disclosure but for explaining the technical idea of the disclosure. Accordingly, the technical scope of the disclosure is not limited by the embodiments. The scope of the disclosure is defined by the appended claims, and all the technical ideas within a range equivalent thereto should be construed as belonging to the scope of the disclosure.

What is claimed is:

1. A display device comprising:
   a display panel including:
      a substrate including an active area and a non-active area which is disposed outside the active area, and
      a plurality of gate lines, a plurality of data lines, and a plurality of subpixels on the substrate;
   a first voltage line disposed on the substrate and including at least a part extending in a first direction, the first voltage line connected to one or more of the plurality of subpixels and configured to receive a first driving voltage, and the at least part of the first voltage line is disposed in the active area;
   a second voltage line disposed on the substrate and including at least a first part extending in the first direction, the second voltage line configured to receive a second driving voltage different from the first driving voltage, and the second voltage line is disposed in the non-active area;
   a third voltage line disposed on the substrate, configured to receive a third driving voltage different from the first driving voltage and the second driving voltage, and including at least a first part extending only in the first direction, wherein the at least part of the third voltage line overlaps the at least part of the first voltage line at an overlapped area in the active area, and a width of the at least part of the third voltage line is smaller than a width of the at least part of the first voltage line at the overlapped area; and
   a driver circuit connected to at least one of the first voltage line or the second voltage line,
   wherein the at least one of the first voltage line or the second voltage line includes a first portion having a first resistance and a second portion having a second resistance greater than the first resistance, and
   wherein when the first voltage line has a first portion and a second portion, the first portion of the first voltage line and the second portion of the first voltage line are disposed in the active area and extended in the first direction, and the second portion of the first voltage line having the second resistance greater than the first resistance of the first portion of the first voltage line is located farther away from the driver circuit than the first portion of the first voltage line in the active area.

2. The display device according to claim 1, wherein the first portion has a first width and the second portion has a second width smaller than the first width.

3. The display device according to claim 2, wherein the width of the first voltage line decreases in a direction away from the location where the driver circuit is connected, or
   wherein a width of the first part of the second voltage line decreases in a direction away from the location where the driver circuit is connected.

4. The display device according to claim 2, wherein
   the driver circuit is configured to supply a driving voltage to the first voltage line as the first driving voltage higher than the second driving voltage, and the first voltage line includes the first portion having the first width and the second portion having the second width, and
   the driver circuit is configured to supply a driving voltage to the second voltage line as the second driving voltage lower than the first driving voltage, and the first part of the second voltage line includes a third portion having a third width and a fourth portion having a fourth width smaller than the third width, the fourth portion located farther away from a location where the driver circuit is connected than the third portion, and
   the first voltage line is between the first part of the second voltage line and a second part of the second voltage line disposed in the first direction, the second part of the second voltage line is disposed at an opposite side of the first part of the second voltage line, and
   the second voltage line includes a third part extending in a second direction different from the first direction, the third part adjoining the first part of the second voltage line and the second part of the second voltage line, and
   at least one of the plurality of subpixels includes an organic light emitting diode (OLED), the first voltage line is connected to a driving transistor of the at least one of the plurality of subpixels, and the second voltage line is connected to a cathode of the OLED of the at least one of the plurality of subpixels.

5. The display device according to claim 1, wherein the third voltage line is connected to the one or more of the plurality of subpixels and configured to receive a third driving voltage,
   wherein a static voltage is applied to the first voltage line and the third voltage line, and
   wherein the third voltage line does not overlap the plurality of data lines.

6. The display device according to claim 5, wherein the width of the third voltage line decreases in a direction away from the location where the driver circuit is connected; or
   wherein the third voltage line is disposed to pass around a contact-hole area of the first voltage line.

7. The display device according to claim 1, wherein the plurality of data lines includes:
   a first data line disposed between the first voltage line and a first subpixel disposed adjacent to one side of the first voltage line; and
   a second data line disposed between the first voltage line and a second subpixel disposed adjacent to another side of the first voltage line, and
   wherein each of the first subpixel, the second subpixel, and a third subpixel disposed adjacent to the first subpixel includes a transparent area,
   wherein the transparent area of the first subpixel and the transparent area of the third subpixel are connected in a second direction different from the first direction, and
   wherein the first data line and the second data line are disposed on an area other than an area between the transparent area of the first subpixel and the transparent area of the third subpixel.

8. The display device according to claim 1, wherein
the driver circuit is configured to supply a driving voltage to the second voltage line as the second driving voltage,
when the second voltage line has a first portion and a second portion, the first part of the second voltage line includes the first portion having a first width and the second portion having a second width, and
a second part of the second voltage line disposed in the first direction including a third portion having a third width and a fourth portion having a fourth width smaller than the third width, the fourth portion located farther away from the location where the driver circuit is connected than the third portion, and the second part of the second voltage line is disposed at an opposite side of the first part of the second voltage line.

9. A display device comprising:
a first voltage line disposed on a substrate of a display panel and including at least a part extending in a first direction, the first voltage line connected to one or more subpixels and configured to receive a first driving voltage, and the at least part of the first voltage line is disposed in an active area;
a second voltage line disposed on the substrate of the display panel and including at least a first part extending in the first direction, the second voltage line configured to receive a second driving voltage different from the first driving voltage;
a third voltage line disposed on the substrate, configured to receive a third driving voltage different from the first driving voltage and the second driving voltage, and including at least a first part extending only in the first direction, wherein the at least part of the third voltage line overlaps the at least part of the first voltage line at an overlapped area in the active area, and a width of the at least part of the third voltage line is smaller than a width of the at least part of the first voltage line at the overlapped area;
a first driver circuit disposed on one side of the display panel; and
a second driver circuit disposed on another side of the display panel, wherein the substrate includes an active area and a non-active area which is disposed outside the active area, and at least a part of the first voltage line is disposed in the active area, and the second voltage line is disposed in the non-active area,
at least one of the first voltage line or the second voltage line includes a first portion having a first resistance, a second portion having a second resistance greater than the first resistance, and a third portion having a third resistance smaller than the second resistance,
when the first voltage line has a first portion, a second portion, and a third portion, the first portion of the first voltage line, the second portion of the first voltage line, and the third portion of the first voltage line are disposed in the active area and extended in the first direction,
the second portion of the first voltage line having the second resistance greater than the first resistance of the first portion of the first voltage line is located farther away from the first driver circuit than the first portion of the first voltage line in the active area, and
the second portion of the first voltage line having the second resistance greater than the third resistance of the third portion of the first voltage line is located farther away from the second driver circuit than the third portion of the first voltage line in the active area.

10. The display device according to claim 9, wherein locations of the at least one of the first voltage line or the second voltage line more adjacent to a connection point to the first driver circuit and a connection point to the second driver circuit are wider than remaining locations thereof.

11. The display device according to claim 9, wherein, in the at least one of the first voltage line or the second voltage line, a width of a portion disposed in the first direction gradually decreases in a direction from a connection point to the first driver circuit to a middle portion of the display panel and in a direction from a connection point to the second driver circuit to the middle portion of the display panel.

12. A display device comprising:
a display panel with an active area and a non-active area which is disposed outside the active area;
a first voltage line disposed in the active area of the display panel, including at least a part extending only in a first direction, and configured to receive a first driving voltage;
a second voltage line disposed in the non-active area of the display panel and configured to receive a second driving voltage different from the first driving voltage;
a third voltage line disposed in the active area of the display panel, including at least a part extending only in the first direction, and configured to receive a third driving voltage different from the first driving voltage and the second driving voltage, wherein the at least part of the third voltage line overlaps the at least part of the first voltage line at an overlapped area in the active area, and a width of the at least part of the third voltage line is smaller than a width of the at least part of the first voltage line at the overlapped area; and
a driver circuit disposed outside the active area,
wherein, in the active area, a portion of the first voltage line disposed in a border of the active area adjacent to the driver circuit is wider than remaining portions of the first voltage line.

13. The display device according to claim 12, wherein the display panel further comprises a plurality of subpixels, each subpixel including a circuit area in which a plurality of circuit elements for driving the subpixel are disposed, an emission area in which a luminous intensity according to image data is expressed, and a transparent area in which none of signal lines and circuit elements of the subpixel are disposed.

14. The display device according to claim 13, wherein the circuit area and the emission area do not overlap each other, and
an area of each subpixel, except for the circuit area and the emission area, is the transparent area.

15. The display device according to claim 12, wherein the driver circuit is connected to the first voltage line, and the driver circuit is disposed at one or two sides of the display panel, or on one or two portions of the display panel; and
the second voltage line is connected to the driver circuit, and
wherein, in the non-active area, a portion of the second voltage line disposed in the first direction and adjacent to a corner of the active area adjacent to the driver circuit is wider than remaining portions of the second voltage line.

16. The display device according to claim 15,
wherein the width of the third voltage line is fixed or decreases in a direction away from the at least one border of the active area.

17. The display device according to claim 16, further comprising data lines for supplying a data voltage, the data lines disposed at two sides of the first voltage line in the first direction, and wherein the data lines do not overlap the first voltage line and the third voltage line.

18. The display device according to claim 17, wherein an insulating layer is disposed on the third voltage line, the first voltage line and data lines are disposed on the insulating layer, and wherein the first voltage line includes a contact-hole area, and the third voltage line has a bypass structure in the contact-hole area of the first voltage line.

19. The display devise according to claim 16, wherein the third voltage line is a reference voltage line through which a reference voltage for an initialization of a subpixel is supplied.

* * * * *